United States Patent

Olin

(10) Patent No.: US 6,708,220 B1
(45) Date of Patent: Mar. 16, 2004

(54) SYSTEM AND METHOD FOR IN-STREAM DATA COMPRESSION

(75) Inventor: Gregg R. Olin, Fairport, NY (US)

(73) Assignee: X/Net Associates, Inc., Fairport, NY (US)

( * ) Notice: Subject to any disclaimer, the term of this patent is extended or adjusted under 35 U.S.C. 154(b) by 0 days.

(21) Appl. No.: 09/444,250

(22) Filed: Nov. 19, 1999

Related U.S. Application Data

(60) Provisional application No. 60/109,049, filed on Nov. 19, 1998.

(51) Int. Cl.$^7$ .............................................. G06F 15/16
(52) U.S. Cl. ..................... 709/247; 709/246; 709/227; 709/228; 709/229; 707/101; 710/68; 382/232
(58) Field of Search ............................... 709/227–229, 709/100–101, 246–247, 203; 345/326–327, 356–357; 341/107, 51; 382/232, 233, 234, 235, 236, 237, 238, 239; 707/101; 710/68

(56) References Cited

U.S. PATENT DOCUMENTS

| | | | |
|---|---|---|---|
| 5,008,871 A | | 4/1991 | Howells ................. 369/28.01 |
| 5,146,439 A | | 9/1992 | Jachmann ............... 369/25.01 |
| 5,153,905 A | | 10/1992 | Bergeron ................. 379/88.23 |
| 5,276,898 A | * | 1/1994 | Kiel et al. ................. 709/105 |
| 5,363,099 A | * | 11/1994 | Allen ........................ 341/109 |
| 5,761,529 A | | 6/1998 | Raji .............................. 710/4 |
| 5,805,932 A | * | 9/1998 | Kawashima et al. .......... 710/68 |
| 5,815,146 A | * | 9/1998 | Youden ....................... 345/327 |
| 5,832,171 A | | 11/1998 | Heist ............................ 386/46 |
| 5,875,436 A | | 2/1999 | Kikinis ........................ 705/34 |
| 5,884,256 A | | 3/1999 | Bennett ...................... 704/235 |
| 5,915,001 A | | 6/1999 | Uppaluru ................. 379/88.22 |
| 5,978,755 A | | 11/1999 | Podhradsky ................ 704/201 |
| 6,125,209 A | | 9/2000 | Dorricott | 
| 6,147,687 A | * | 11/2000 | Wanderski .................. 345/356 |
| 6,243,761 B1 | * | 6/2001 | Mogul ........................ 709/246 |

\* cited by examiner

*Primary Examiner*—Robert B. Harrell
*Assistant Examiner*—Hieu C. Le
(74) *Attorney, Agent, or Firm*—Nixon Peabody LLP

(57) ABSTRACT

A system and method for compressing a data set. The method comprises the steps of: (i) requesting a data set from a server to be sent to a user, (ii) determining the size of the data set to be sent, (iii) compressing the data set, (iv) assigning a compression flag to the compressed data set, (v) sending the compression flag and compressed data set to the user, (vi) inspecting the data set for compression, (vii) uncompressing the data set; and (viii) processing the data set. Alternatively, upon determining the size of the data set to be sent, assigning an uncompressed flag to the data set, sending the uncompressed flag and data set to the user, inspecting the data set for compression, and processing the data set. In another alternative embodiment, upon determining the size of the data set to be sent, sending the uncompressed data set to the user, inspecting the data set for compression, and processing the data set.

9 Claims, 5 Drawing Sheets

SYSTEM AND METHOD FOR IN-STREAM DATA COMPRESSION

BACKGROUND OF THE INVENTION

This application claims the benefit of U.S. Provisional Patent Application Ser. No. 60/109,049 filed Nov. 19, 1998.

The present invention relates generally to data manipulation and more particularly to a novel system and method for data compression.

Data requests made to a server can often result in a relatively large amount of data sent back to the user. In the event that a data set is extraordinarily large, it is preferred that the data be compressed before being sent in order to decrease the transfer time, particularly when data transfer is taking place over a modem. While data compression is useful in many contexts, the process of compressing data takes time. Indeed, where a relatively small amount of data is to be transferred, the compression process can take more time than it would take to simply transfer the data uncompressed.

Conventional data compression technology has focused primarily on the transfer or transmission of data representative of voice, image, and file information over traditional user/server networks. Internet application vendors such as Netscape, Microsoft and SUN Microsystems incorporate automatic data compression technologies when delivering applications, applets, files, or objects. With the rapid proliferation of wide area networks and the Internet, however, the accompanying reduction in bandwidth connections has lead to a need for alternative data compression technology.

SUMMARY OF THE INVENTION

In accordance with one aspect of the present invention is a heuristic in-stream data compression system. The system comprises a computer-based input device, a server having heuristic compression decision logic, and a communications infrastructure linking the input device to the server. A database linked to the server maintains workstation and network performance data. Also, an applications database is linked to the database server for providing selected server applications.

According to another aspect of the present invention is a method for heuristic in-stream data compression, which comprises the steps of: (i) determining the mass of a selected data set to be transmitted in uncompressed form, upon each transmission from a server to an input device, (ii) projecting the mass of the data set in compressed form, (iii) determining the transfer rate of the data set uncompressed, in real-time between the input device and the server, (iv) determining the connection time required to move the data set in compressed and uncompressed form; (v) estimating the time required at the server to compressing the data set, (vi) estimating the time required at the input device to uncompress the data set; and (vii) comparing the connection time required to move the data set in compressed form at step (iv) to the sum of the connection time required to move the data set in uncompressed form, the time at the server to compress the data set, and the time at the input device to uncompress the data set.

In accordance with a further aspect of the present invention is a method for compressing a data set, which comprises the steps of: (i) requesting a data set from a server to be sent to a user, (ii) determining the size of the data set to be sent, (iii) if the size of the data set is greater than or equal to a selected size, compressing the data set, (iv) assigning a compression flag to the compressed data set, (v) sending the compression flag and compressed data set to the user, (vi) inspecting the data set for compression, (vii) uncompressing the data set; and (viii) processing the data set.

According to still another aspect of the present invention is a method for compressing a data set, which comprises the steps of: (i) requesting a data set from a server to be sent to a user, (ii) determining the size of the data set to be sent, (iii) if the size of the data set is less than a selected size, assigning an uncompressed flag to the data set, (iv) sending the uncompressed flag and data set to the user, (v) inspecting the data set for compression; and (vi) processing the data set.

According to yet a further aspect of the present invention is a method for compressing a data set, which comprises the steps of: (i) requesting a data set from a server to be sent to a user, (ii) determining the size of the data set to be sent, (iii) if the size of the data set is less than a selected size, sending the uncompressed data set to the user, (iv) inspecting the data set for compression; and (v) processing the data set.

Accordingly, it is an object of the present invention to provide an improved system and method for data compression.

Another object of the present invention is to provide a novel system and method for compression of in-stream data.

A further object of the present invention is to enhance data transfer between a user and server.

Yet another object of the present invention is to improve the speed and quality of data transfer.

Still another object of the present invention is to provide a durable, reliable system for the rapid transfer of data between a user and server simply, efficiently and economically.

Yet a further object of the present invention is to enhance data transfer over the Internet.

Another object of the present invention is to provide a system and method for optimizing the speed of data transfer over a wide range of data set sizes.

The present invention will now be further described by reference to the following drawings which are not intended to limit the accompanying claims.

BRIEF DESCRIPTION OF THE DRAWINGS

The same numerals are used throughout the figure drawings to designate similar elements. Still other objects and advantages of the present invention will become apparent from the following description of the preferred embodiments.

DETAILED DESCRIPTION OF THE PREFERRED EMBODIMENTS

Figure 1:
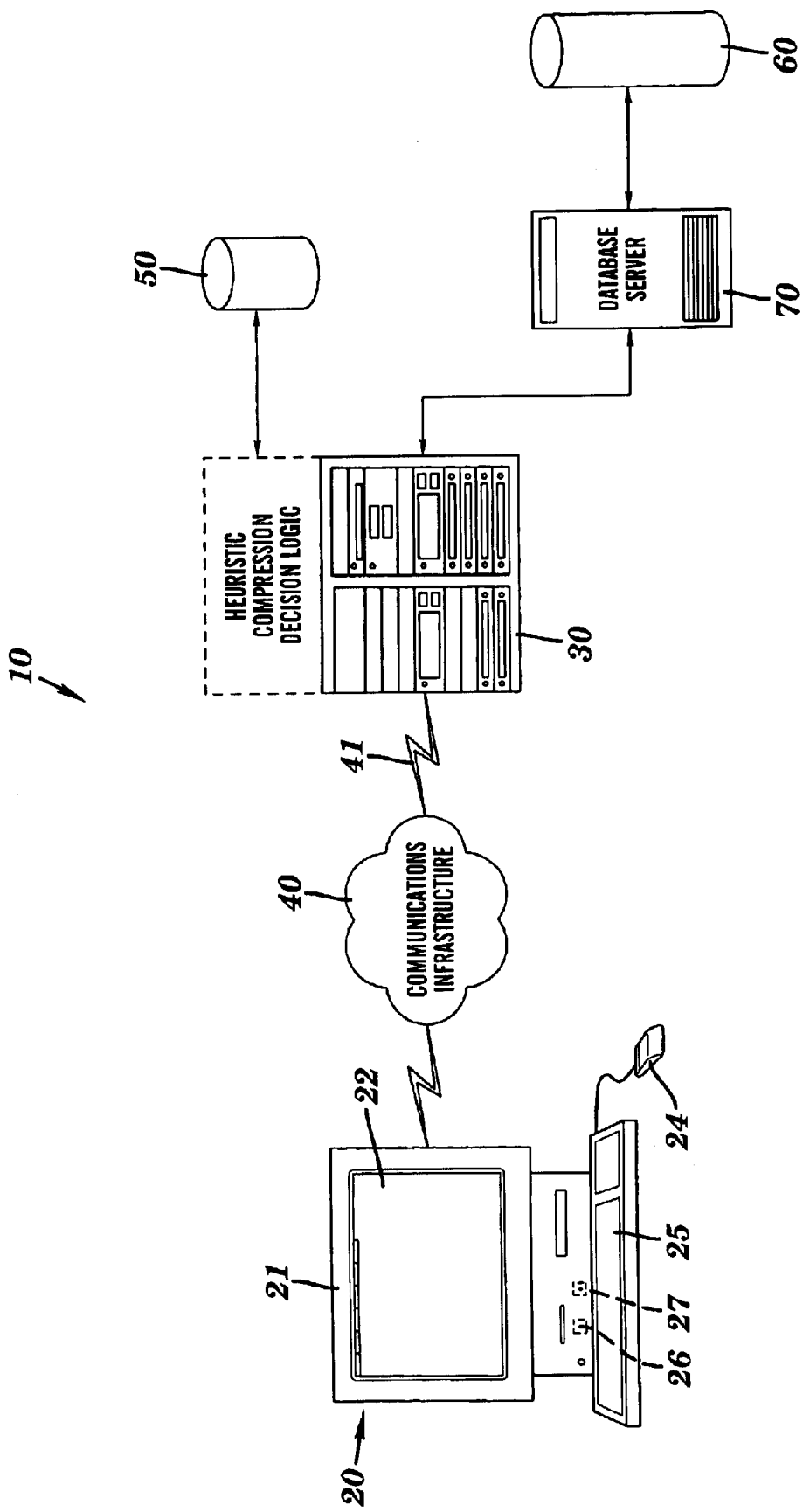
FIG. 1 is a schematic showing a system and method for in-stream data compression according to one aspect of the present invention.
Figure 2:
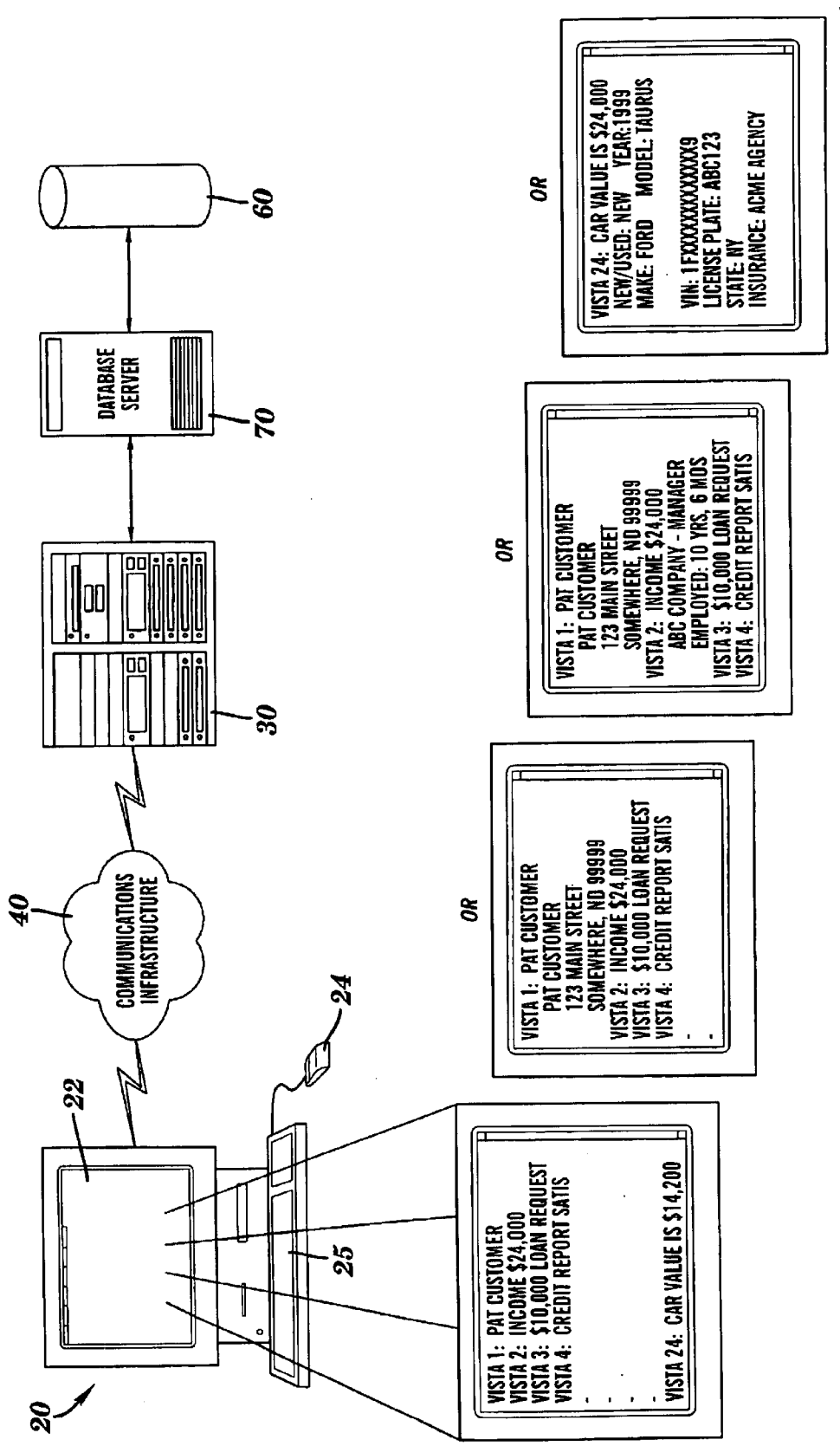
FIG. 2 is a schematic showing a system and method for in-stream data compression according to another aspect of the present invention.

Referring now to the drawings and, more particularly, to FIGS. 1–5, there is shown generally a specific, illustrative system 10 and method for in-steam data compression according to various aspects of the present invention. As shown in FIG. 1, the system comprises a computer-based input device 20, a server 30 having heuristic compression decision logic, and a communications infrastructure 40 linking the input device to the server. A database 50 desirably linked to the server maintains workstation and network performance data. An applications database 60 linked to a database server 70 houses selected data sought by a user.

At the kernel of the present invention is the automatic compression of a data set transacted within a selected application upon operations between the user and application. In contrast to conventional data compression which occurs upon delivery of applications, applets, files or objects over the Internet, the present invention provides heuristically driven, in-stream data compression that, in effect, rides on the server platform. This not only allows compression of the content relevant to the particular application, e.g., business, but also data compression in real-time for continuously changing data sets and, more particularly, of the desired content.

Generally speaking, where a relatively large data set is requested by the user, the data is preferably compressed to reduce the amount of data needed to be transferred and, consequently, decrease transfer time. Where a relatively small data set is to be transferred, the duration of the compression process can often be greater than the time it would take to simply transfer the data set uncompressed. Accordingly, for a given system and set of parameters, there is a point at which the size of the data set being transferred becomes sufficiently large that compression of the data would reduce the total transfer time. The system and method of the present invention determines, preferably from a server platform, when a selected data set should be compressed and informs the user accordingly.

Figure 3:
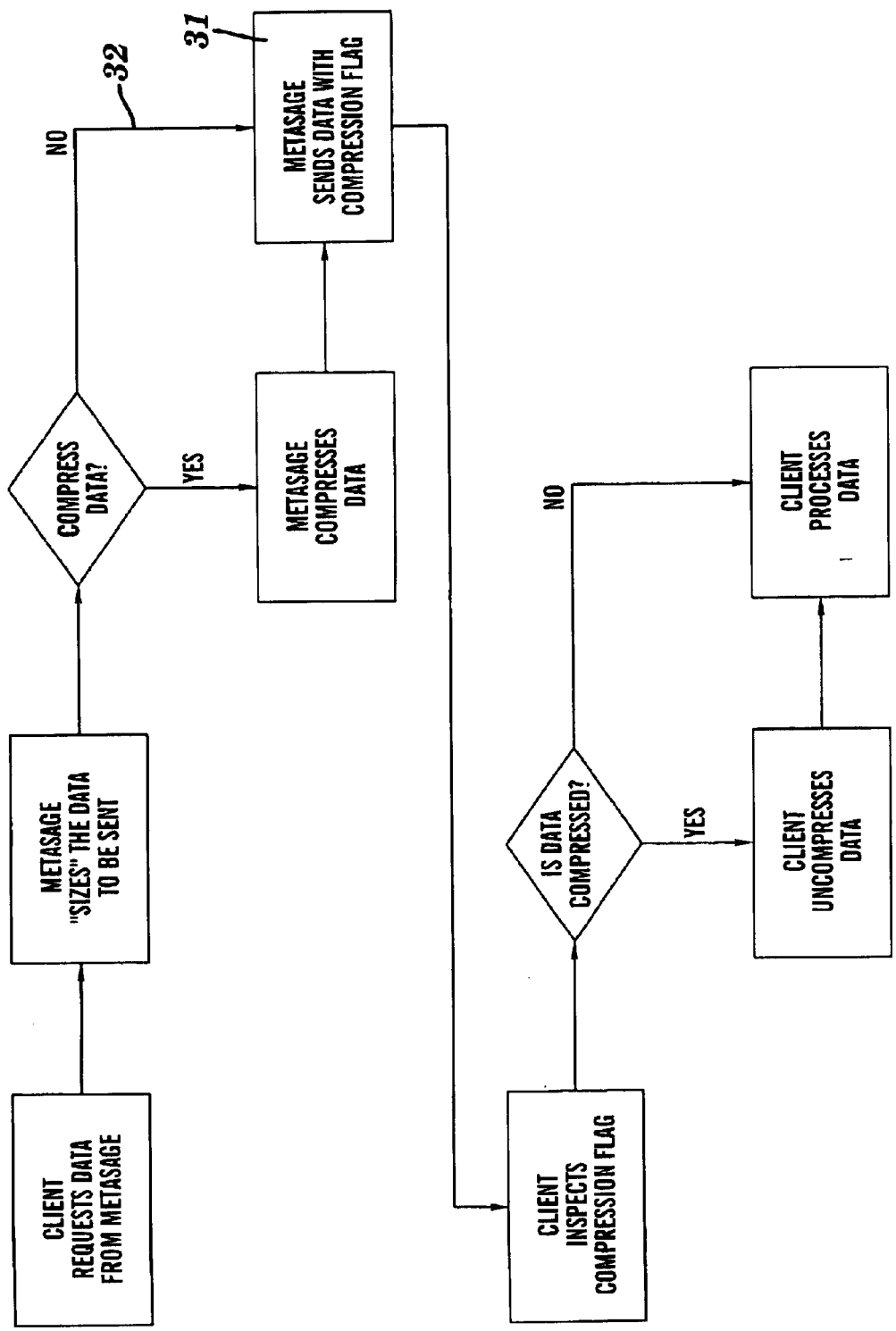
FIG. 3 is a flow diagram showing a compression handling process from the user's perspective in accordance with the present invention.

As set forth in FIG. 3, initially the user at input device 20 inputs a request through communications port 26 of the device to obtain, for instance, a relatively large data set. According to one aspect of the present invention, server 30 is provided with two modes of response. In the first mode, a flag is sent to inform the user that the data set is sufficiently large that it will be compressed before it is senl The second mode provides a flag to the user advising that the data set will be sent in its normal or uncompressed state. The appropriate flag is sent to the user in response to his/her request for data.

As shown generally in FIG. 1, the input device is preferably a conventional desktop computer 21, laptop or the like for operation on a 32-bit wintel platform with a TCP/IP connection to the server. The device includes a display monitor 22, a communications modem 23, e.g., conventional, Internet compatible, and a mouse 24, keyboard 25 and/or other mode of input. Desirably, the device is suitable for interactive connection to and communications with server 30, e.g., 32-bit, platform independent via JAVA, for sending and receiving data sets over the Internet, an Intranet, an Extranet or the like.

According to one aspect of the present invention, the input device, upon user authentication, receives necessary data in the form of objects for the user to perform all job functions within the licensed application suite based on their role in the enterprise. The server is responsible for delivering a dynamically assembled set of objects which, when assembled by the input device, presents the user with a user-specific interface.

The input device is preferably linked to the server over a traditional communications network 40 which includes traditional wire-based, fiber optic, wireless and/or like connections such as a land-based telephone system, satellite or other conventional telecommunications network. Their structure and function are considered well-known to Turning now to processing aspects of the present invention, server 30 (e.g., a MetaSage Server) preferably enlists an applications operating system which handles all common user needs, e.g., in the context of business applications, vertical business application development, deployment, and maintenance. According to one aspect of the present invention, an N-tier, distributed, client/server architecture has been found particularly wellsuited for business to business applications. Representative functions include management, rules, security, access, user profiles, and communications. This arrangement is considered particularly well-suited to wide area network environments, lending suitability to a wide variety of enterprise architectures.

Figure 5:
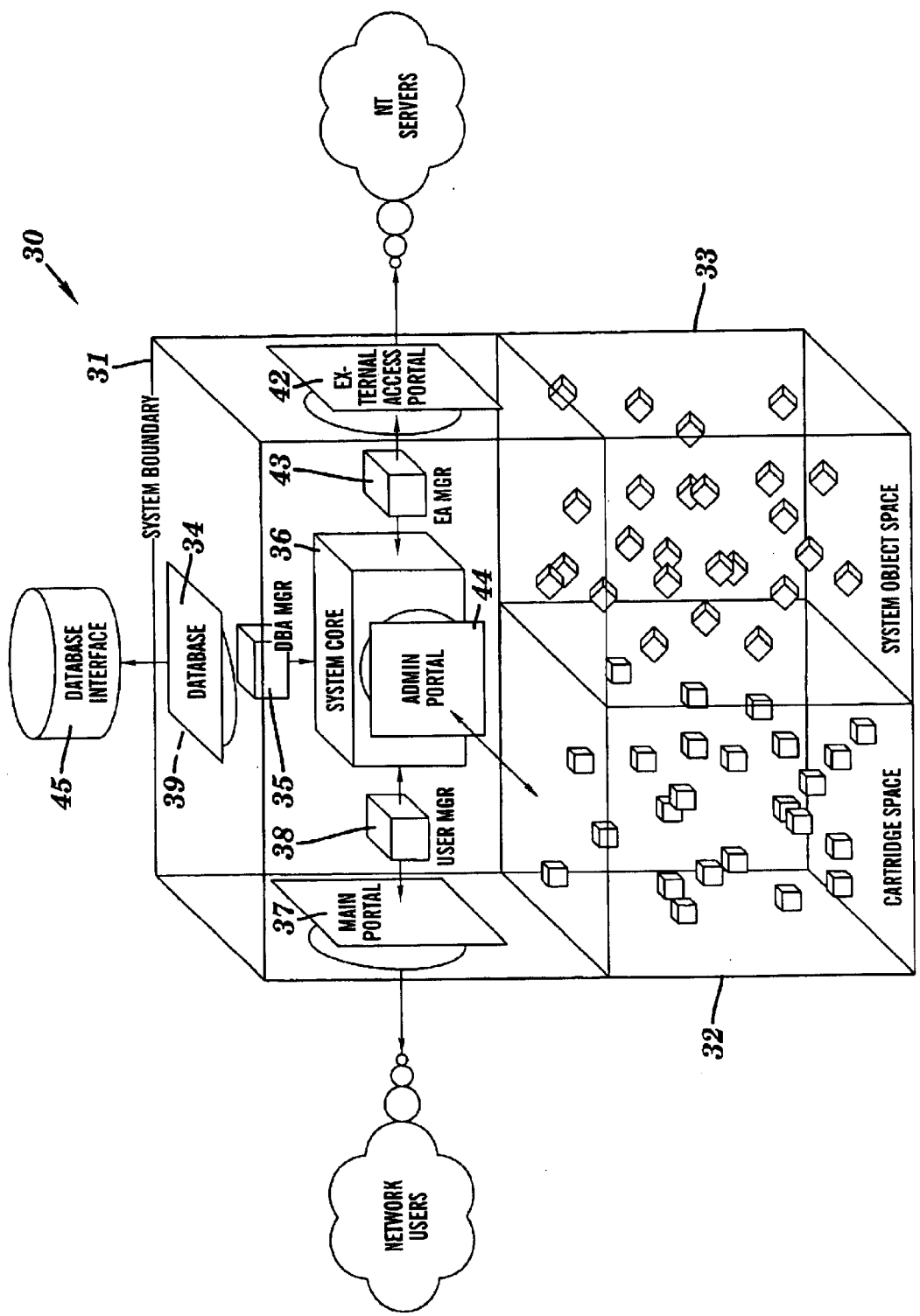
FIG. 5 is a schematic illustrating a MetaSage server according to one aspect of the present invention.

As shown in FIG. 5, the server, according to one embodiment, enlists a novel architecture which includes system boundary 31, cartridge space 32, and system object space 33 components. This system boundary houses server database 34 and database manager 35, both being linked to system core 36. It is preferred that the server of this embodiment provide and manage four major portals.

The first is a user access or main portal 37. This portal allows any user software to be created or modified for communication with server 30 via TCP/IP and sockets. In this manner, the user need not continuously update his/her equipment with each advance in communications protocol or equipment. The user access portal is suitable for user systems that are browser-based, a component, and/or an application. The system core communicates with this portal through a user manager 38 housed within system boundary 31.

Second is a database storage portal 39. This portal through a database interface 45 permits database 34 to be used as a data repository by any vertical business application deployed by the server. It also allows use of any number of databases whether from a single vendor or many different vendors. Accordingly, using JDBC and/or database-specific API technologies, the server communicates with various databases via its database interface (DBI).

The third portal 42 is for external services. This allows the server to communicate and interface with any other computer system. External services include another server of the type described herein, an NT server-based service, a dedicated workstation's application, a mainframe/mini-computer host process, a satellite feed, or any other process capable of providing a defined protocol for electronic communication. The external access portal communicates with the system core through an EA manager 43.

The fourth and last portal 44 is for remote system administration. This portal permits the server and its vertical business applications to be monitored and modified remotely. Advantageously, the server also allows dynamic upgrading and updating of its vertical business applications, without user interruption.

Typical vertical business application processes and functions are as follows: (i) profiles such as system administrator, groups and users, (ii) security including system process and function, and application process and function, and finally (iii) workflow including management rules, business rules and process milestones. Based on the foregoing profile, any vertical business application can be created on the server quickly and efficiently by focusing on the actual business application layer. Moreover, dynamic deployment of additional business applications and functions within applications is facilitated without interference with existing applications running on the server.

The foregoing applications are preferably accessible through alternate delivery channels including: Internet, automated banking machines, call centre, IVR, kiosks and remote access for roving residential mortgage lenders, within the spirit and scope of the present invention. Real-time applications processing is also desirable, i.e., not only updating ATB's mainframe system and printing requirements, but also changing to operational controls such as new operators on a real-time basis.

A system of this general description is set forth in co-pending U.S. Provisional Patent Application Ser. No. 60/109,049, filed on Nov. 19, 1998 by Gregg R. Olin, W. Scott Thoman, Russell R. Moll, Donald P. Thornton, Jr. and Brian S. Pagano, the disclosure of which is hereby incorporated by reference in its entirety.

Although the present invention is shown and described for use with business applications, it is considered applicable to any system, network or the like for general data processing applications giving consideration to the purpose for which the present invention is intended. Conventional server technology and software applications may also be integrated with the foregoing, alternatively or concurrently therewith, consistent with the objectives set forth herein.

Preferably, the foregoing applications and data is housed and maintained on applications database 60 linked to a database server 70. Database 50 maintains workstation and network performance data. Alternatively, as illustrated generally in FIG. 2, database 50 may be omitted within the spirit and scope of the present invention. Conventional databases and database servers are considered appropriate for operation of the present invention, as will be appreciated by those skilled in the art. In addition, communication links between such databases, servers or the like may be accomplished by known methods, e.g., wire-based connections, fiber optics, wireless transmissions and/or the like.

Figure 4:
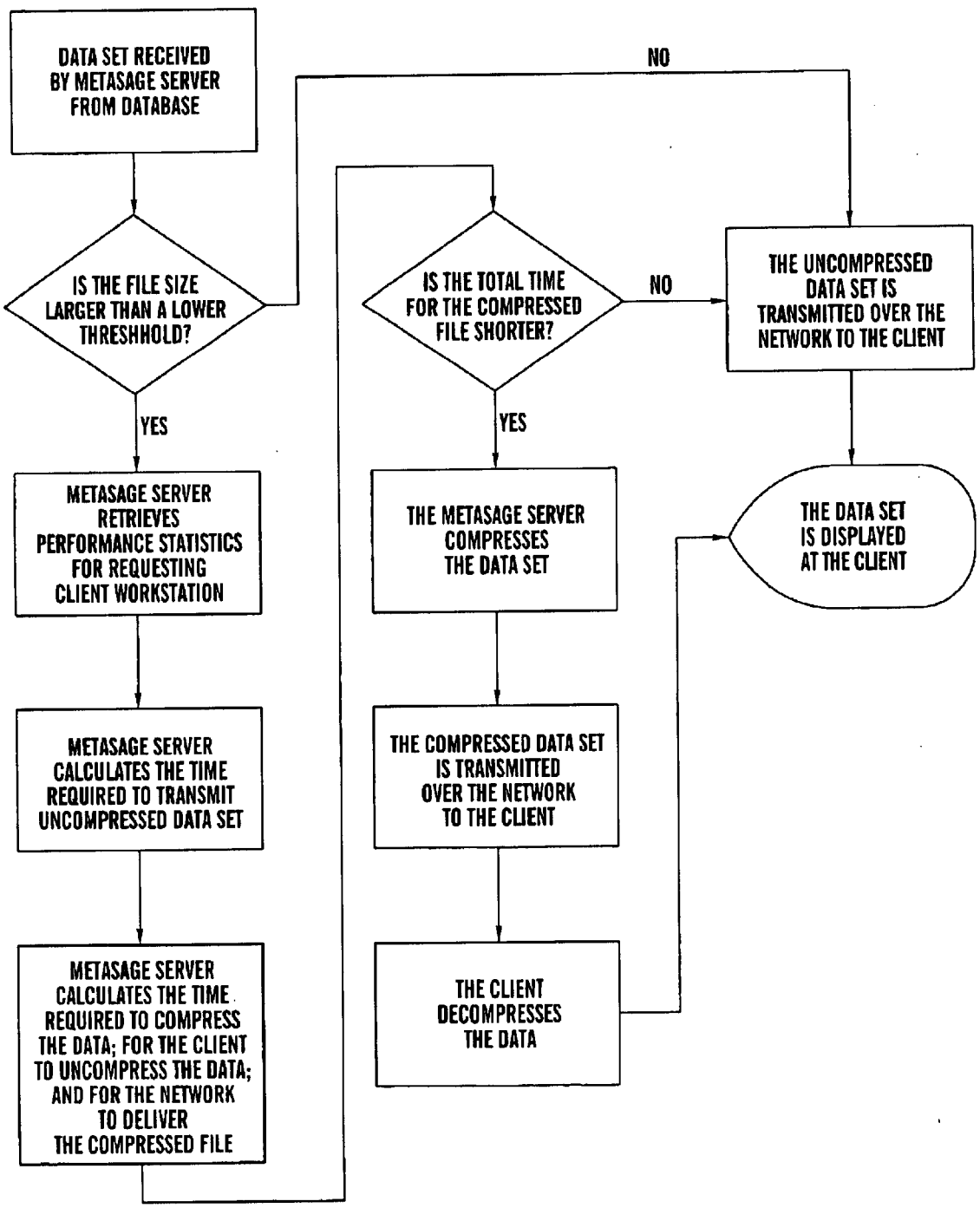
FIG. 4 is a flow diagram showing a compression handling process from the server's perspective in accordance with the present invention.

Turning now to server operation, as illustrated in FIGS. 3 and 4, initially each data set is sized and a determination is made as to whether it should be compressed. If appropriate, the data set is compressed. When the compression process has been completed, the compressed data set is transferred with corresponding flag to the user indicating that the data being received is in compressed form. The compressed data set is preferably sent to the user through a listening port 27 of the input device. Upon arrival at the input device, the user inspects the flag for compression. If the flag is set, the user then initiates decompression of the data set Upon decompression, the data set is then forwarded to the selected applications program in operation at the input device by the user.

The present invention advantageously utilizes heuristic compression decision logic to effect in-stream data compression. In accordance with one aspect of the present invention, initially, upon each transmission from a server to an input device, the mass of a selected data set to be transmitted in uncompressed form is determined. The mass of the data set in compressed form is also determined. Next, the transfer rate of the uncompressed data set in real-time between the input device and the server is computed. Thereafter, the connection time required to move the data set in compressed and uncompressed form is calculated. The time required at the server to compress the data set is then estimated as well as the time required at the input device to uncompress the data set. Finally, the connection time required to move the data set in compressed form is compared to the sum of the connection time required to move the data set in uncompressed form, the time at the server to compress the data set, and the time at the input device to uncompress the data set.

If the connection time required to move the data set in compressed form is less than the aforementioned sum, then the process for data compression is initiated. If the connection time for transferring the compressed data set is greater than this sum, then the data set is transmitted to the user in uncompressed form.

Although the data compression steps of the present invention are shown and described in a relatively discrete order, it will be appreciated that any suitable order of heuristic logic may be utilized within the spirit and scope of the present invention.

To determine for a given system the point at which compression becomes beneficial, various methods may be utilized. In one embodiment of the present invention, a configurable value is selected which corresponds to the size of the data set where compression should begin. This value is set manually and is determined by observing and comparing the transfer time with the size of the data set to be transferred. When the value is met or exceeded, data compression software is initiated.

Alternatively, the server monitors and records the time the transfer of selected data sets and heuristically determines the appropriate benchmark value where data set compression should begin. As network and modem speeds vary, continuous monitoring by the server would enable this value to be self-adjusting as more data requests and transfers are made. Over time, the value adjusts automatically so as to maintain the data transfer rate at an optimum level regardless of network/modem speed, server, and other system characteristics.

According to another aspect of the present invention is a method for compressing a data set passing from a server to a user. Initially, a request is made to send the data set from the server to the user. The size of the data set to be sent is then determined. If the size of the data set is greater than or equal to a selected size, then the data set is compressed and a compression flag is assigned to the compressed data set. The compression flag and compressed data set are to the user. The data set is, in turn, inspected for compression, uncompressed, and processed.

If the size of the data set is less than a selected size, an uncompressed flag is assigned to the data set. The uncompressed flag and data set are then sent to the user, inspected for compression, and processed. In a further embodiment, if the size of the data set is less than a selected size, the uncompressed data set is sent to the user, inspected for compression, and processed.

Overall, the present invention advantageously provides automatic compression of a data set transacted within a selected application upon operations between the user and application. Heuristically based in-stream data compression is provided that, in effect, rides on the server platform. This not only allows compression of the content relevant to the particular application, but also data compression in real-time for continuously changing data sets and, more particularly, of the desired content. In this manner, complex data sets, e.g., spread sheets, can be delivered to a user at least 3.6 times faster than conventional data compression technology.

Various modifications and alterations to the present invention may be appreciated based on a review of this disclosure.

These changes and additions are intended to be within the scope and spirit of this invention as defined by the following claims.

What is claimed is:

1. A heuristic in-stream data compression system, which comprises:

a first computer device;

a second computer device with a heuristic compression decision logic system that compresses a data set for transmission when an amount of time required to compress, transfer and uncompress the data set is less than the amount of time to transfer the data set without the compression; and communications system linking the first computer device to the second computer device.

2. The system set forth in claim 1 wherein the first computer device is a desktop computer.

3. The system set forth in claim 1 wherein the communications system is a land-based telephone system.

4. The system set forth in claim 1 wherein the communications system is a satellite based communications system.

5. The system set forth in claim 1 wherein at least one of the linkages between the input device ad the heuristic system is wire-based.

6. The system set forth in claim 1 wherein at least one of the linkages between the input device and the heuristic system is fiber optic based.

7. The system set forth in claim 1 wherein at least one of the linkages between the input device and the heuristic system is wireless.

8. The system as set forth in claim 1 wherein the heuristic compression decision logic system assigns a flag to the data sets the flag having a first condition when the data set is compressed and a second condition when the data set is uncompressed.

9. A system comprising:

a first communication system;

a second communication system; and a communications infrastructure linking the first and second communication systems, wherein at least one of the first and second communication systems has a heuristic compression decision logic system that compresses data when an amount of time required to compress, transfer and uncompress the data is less than the amount of time to transfer the data without the compression.

* * * * *